United States Patent
Suthar et al.

(10) Patent No.: US 7,199,039 B2
(45) Date of Patent: Apr. 3, 2007

(54) INTERCONNECT ROUTING OVER SEMICONDUCTOR FOR EDITING THROUGH THE BACK SIDE OF AN INTEGRATED CIRCUIT

(75) Inventors: Sailesh C. Suthar, Portland, OR (US); Paul J. Hack, Portland, OR (US); Syed N. Sarwar, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 327 days.

(21) Appl. No.: 10/440,999

(22) Filed: May 19, 2003

(65) Prior Publication Data

US 2004/0232414 A1  Nov. 25, 2004

(51) Int. Cl.
*H01L 21/4763* (2006.01)

(52) U.S. Cl. ...................................... 438/619; 438/620

(58) Field of Classification Search ........ 438/618–621, 438/411, 459, 462; 257/621, 276, 502, 508
See application file for complete search history.

(56) References Cited

U.S. PATENT DOCUMENTS

| | | | | |
|---|---|---|---|---|
| 4,751,562 A | * | 6/1988 | Yamamura | 257/276 |
| 5,805,421 A | * | 9/1998 | Livengood et al. | 361/736 |
| 5,811,868 A | * | 9/1998 | Bertin et al. | 257/516 |
| 5,904,486 A | * | 5/1999 | Livengood et al. | 438/4 |
| 5,952,247 A | | 9/1999 | Livengood et al. | 438/734 |
| 6,383,924 B1 | * | 5/2002 | Farrar et al. | 438/667 |
| 6,440,637 B1 | * | 8/2002 | Choi et al. | 430/296 |
| 6,734,572 B2 | * | 5/2004 | Nin | 257/797 |
| 2003/0183786 A1 | * | 10/2003 | Seidel et al. | 250/504 R |

* cited by examiner

*Primary Examiner*—Theresa T. Doan
(74) *Attorney, Agent, or Firm*—Trop, Pruner & Hu, P.C.

(57) ABSTRACT

Circuit edits may be performed through the back side of an integrated circuit die. In one embodiment, a circuit edit is achieved by exposing first and second circuit edit connection targets through a semiconductor substrate of the integrated circuit die from the back side. An insulating layer is not deposited over the first and second circuit edit connection targets and the exposed semiconductor substrate. Next, a conductor is deposited over the circuit edit connection targets from the back side of the integrated circuit to couple together the circuit edit connection targets.

6 Claims, 5 Drawing Sheets

INTERCONNECT ROUTING OVER SEMICONDUCTOR FOR EDITING THROUGH THE BACK SIDE OF AN INTEGRATED CIRCUIT

BACKGROUND

The present invention relates generally to the field of integrated circuit testing and, more particularly, to a method and an apparatus for performing circuit edits in an integrated circuit for the purpose of verifying design engineering change orders.

Once a newly designed integrated circuit has been formed on a semiconductor substrate, the integrated circuit must be thoroughly tested to ensure that the circuit performs as designed. Portions of the integrated circuit that do not function properly are identified so that they can be fixed by correcting the design of the integrated circuit. This process of testing an integrated circuit to identify problems with its design is known as debugging. After debugging the integrated circuit and correcting any problems with its design, the final fully functional integrated circuit designs are used to mass produce the integrated circuits in a manufacturing environment for consumer use. During the debugging process, it is often necessary to add, delete or reroute signal line connections within the integrated circuit.

With continuing efforts in the integrated circuit industry to increase integrated circuit speeds as well device densities, there is a trend towards using flip-chip technology when packaging complex high speed integrated circuits. Flip-chip technology is also known as control collapse chip connection (C4) packaging. In flip-chip packaging technology, the integrated circuit die is flipped upside-down. By flipping the integrated circuit die upside-down, ball bonds may be used to provide direct electrical connections from the bond pads directly to the pins of a flip-chip package.

One consequence of the integrated circuit die being flipped upside-down in a flip-chip package is that access to the internal nodes of integrated circuit die for circuit edit purposes is more difficult. Circuit editing techniques used with wire bond technology are based on performing the circuit edits on metal interconnects through the front side of the integrated circuit die. However, with flip-chip packaging technology, this front side methodology is not feasible since the integrated circuit die is flipped upside-down.

In some cases, a flip-chip may be edited from the back side by thinning down the semiconductor substrate and then trenching down to a point where an edit is desired to be made. A conductive material may be deposited between two locations in order to make a new circuit connection from the back side of the integrated circuit. However, to do so, an insulator is utilized between the conductive connection and the remainder of the circuit. In some cases, an insulator is applied before the conductor is deposited. In other cases, the conductor is only deposited over the field oxide. The provision of an intermediate dielectric layer between the deposited metal and the substrate reduces the overall throughput time of circuit editing. Moreover, the access holes provided to make the connections must be made sufficiently large to accommodate, not only the metal, but also the underlying insulator.

Thus, there is a need for better ways to make circuit edits from the back side of an integrated circuit die.

DETAILED DESCRIPTION

A flip-chip packaged integrated circuit die 201 may include two unconnected signal lines 217 and 221 in one embodiment of the present invention. The signal lines 217 and 221 may be disposed in a dielectric isolation layer 225 in integrated circuit die 201. In one embodiment, signal lines 217 and 221 are made of a conductive material, such as, for example, metal or polysilicon. The signal lines 217 and 221 may be in the same or different metallization layers.

Figure 1:
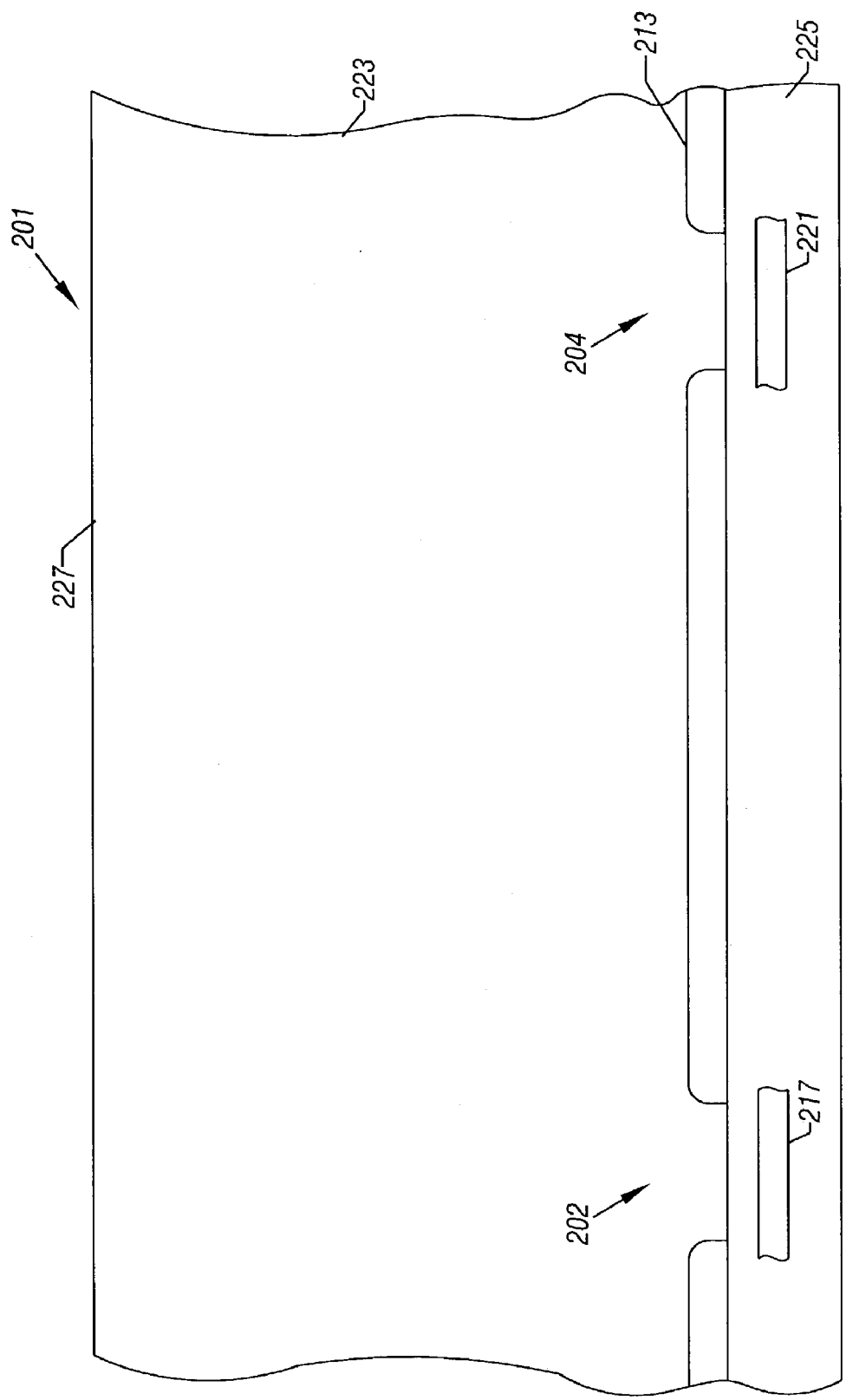
FIG. 1 is an enlarged cross-section of a flip-chip packaged integrated circuit die including two unconnected circuit edit connection targets which are to be connected in accordance with one embodiment of the present invention.

In one embodiment, connection target 202 is a passive region through which line 217 may be accessed and connection target 204 is a passive region through which line 221 may be accessed. A passive region may be interpreted as a region disposed in the semiconductor substrate for providing a signal access location without disrupting the operation of the die 201. Passive regions may include isolation regions, such as field oxide regions in one embodiment. The semiconductor substrate 223 may include silicon, gallium arsenide, or silicon germanium, as examples. As shown in the embodiment illustrated in FIG. 1, the targets 202, 204 are disposed between active regions 213 which may, for example, include transistors or other active devices.

A circuit designer may decide to perform a circuit edit on integrated circuit die 201 by coupling together signal lines 217 and 221. This determination may be made after testing the circuit die 201 and understanding that the circuit is not operating as desired, for example. In one embodiment, connection targets 202 and 204 are accessed through the back side 227 of flip-chip packaged integrated circuit die 201 to access signal lines 217 and 221, respectively. In another embodiment, signal lines 217 and 221 are accessed directly as circuit edit connection targets through the back side 227 of integrated circuit die 201. In general, any conductor in the integrated circuit die carrying a signal may be considered a connection target in accordance with one embodiment of the present invention. Possible connection targets include, but are not limited to, metal lines, metal interconnects, polysilicon, diffusion and well taps.

In one embodiment, flip-chip packaged integrated circuit die 201 is thinned in the regions above connection targets 202 and 204 when a circuit edit is to be performed in accordance with one embodiment of the present invention.

Figure 2:
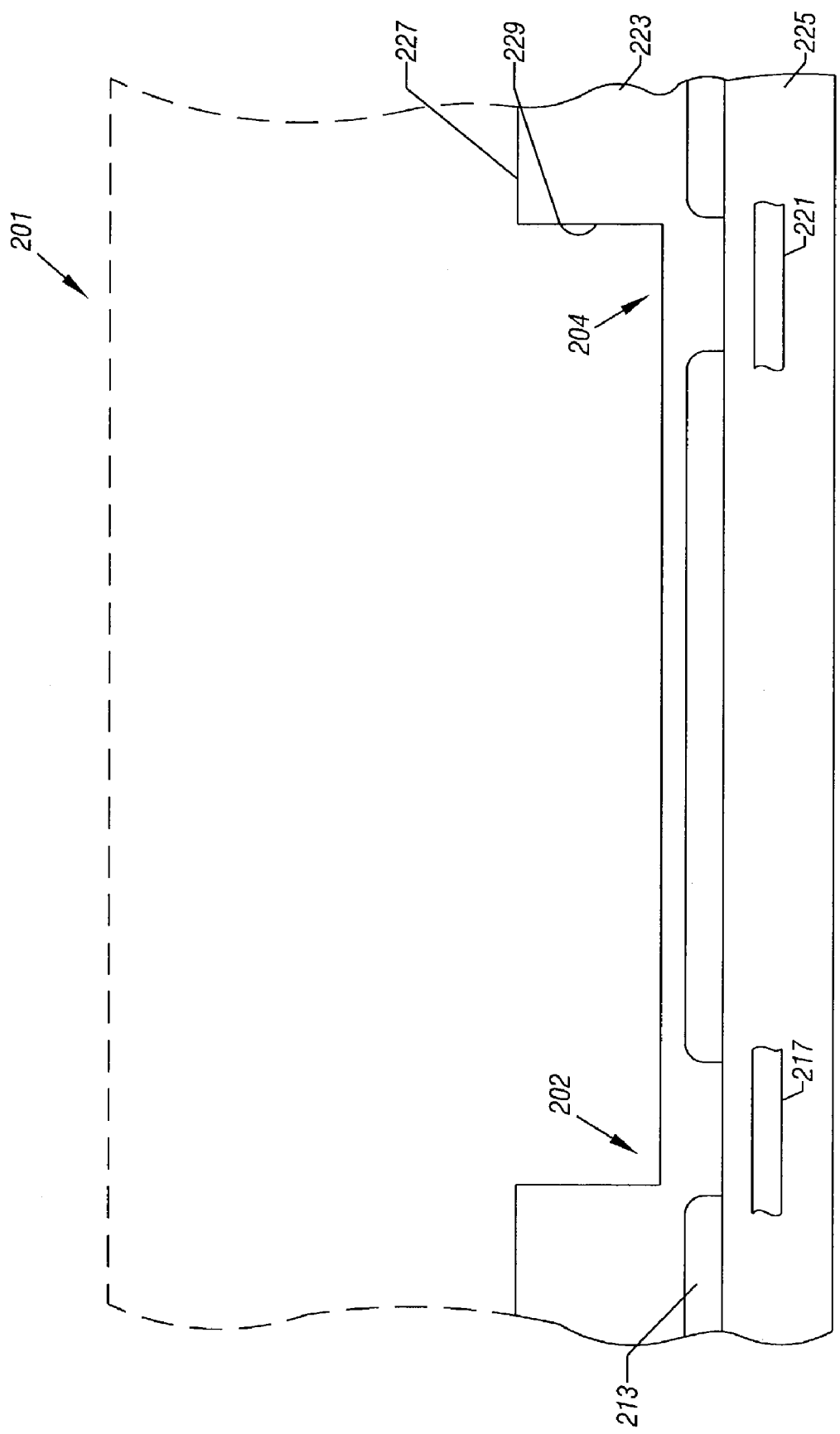
FIG. 2 is an enlarged cross-section of a flip-chip packaged integrated circuit die that has been thinned from the back side in accordance with one embodiment of the present invention.

As shown in FIG. 2, a back side portion of semiconductor substrate 223 is removed above connection targets 202 and 204 from back side 227. In one embodiment, integrated circuit die 201 is globally thinned using well known techniques, such as, for example, but not limited to mechanical polishing, mechanical machining, or chemical etching. In another embodiment, integrated circuit die 201 may be locally trenched in the regions proximate to connection targets 202 and 204 to remove back side portion 229 using well known techniques. In yet another embodiment, integrated circuit die 201 is thinned using a combination of global and local thinning techniques.

A back side portion 229 of semiconductor substrate 223 above connection targets 202, 204 is milled away to form the trench 229 as shown in FIG. 2. In one embodiment, well known milling techniques may be used, such as, for example, a focused ion beam milling tool.

Figure 3:
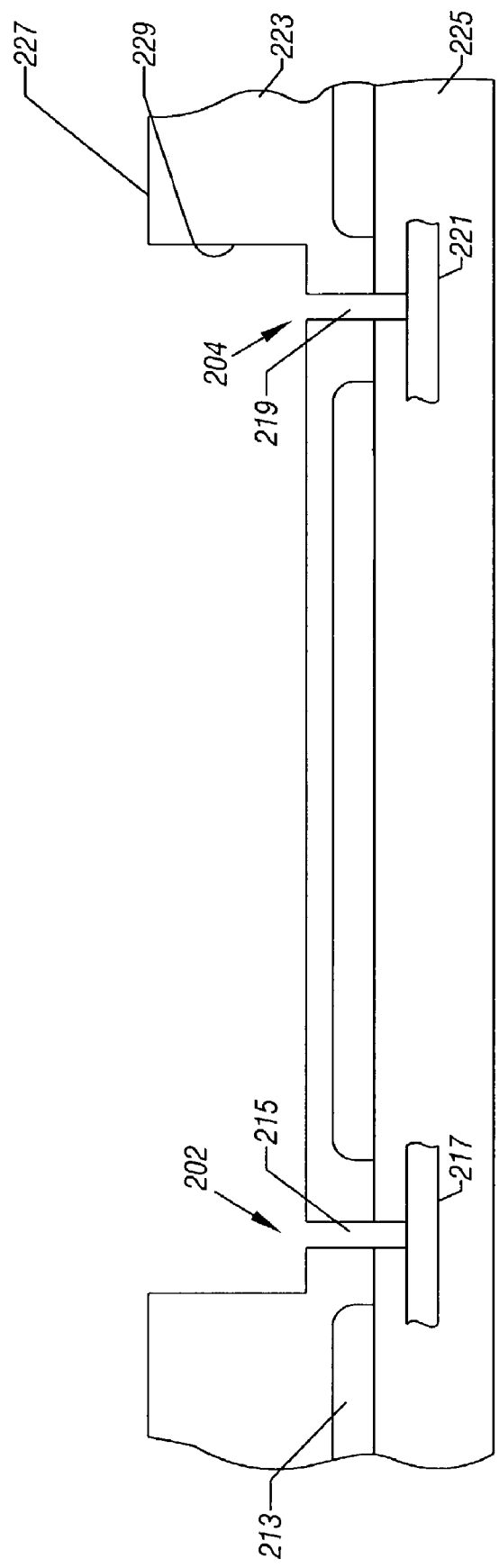
FIG. 3 is an enlarged cross-section of an integrated circuit die with two circuit edit connection targets that have been exposed from the back side in accordance with one embodiment of the present invention.

Next, vias 215 and 219 may be formed through the targets, 202, 204 to the lines 217, 221 as shown in FIG. 3. The vias 215, 219 extend through substrate 223 and layer 225 in one embodiment.

Figure 4:
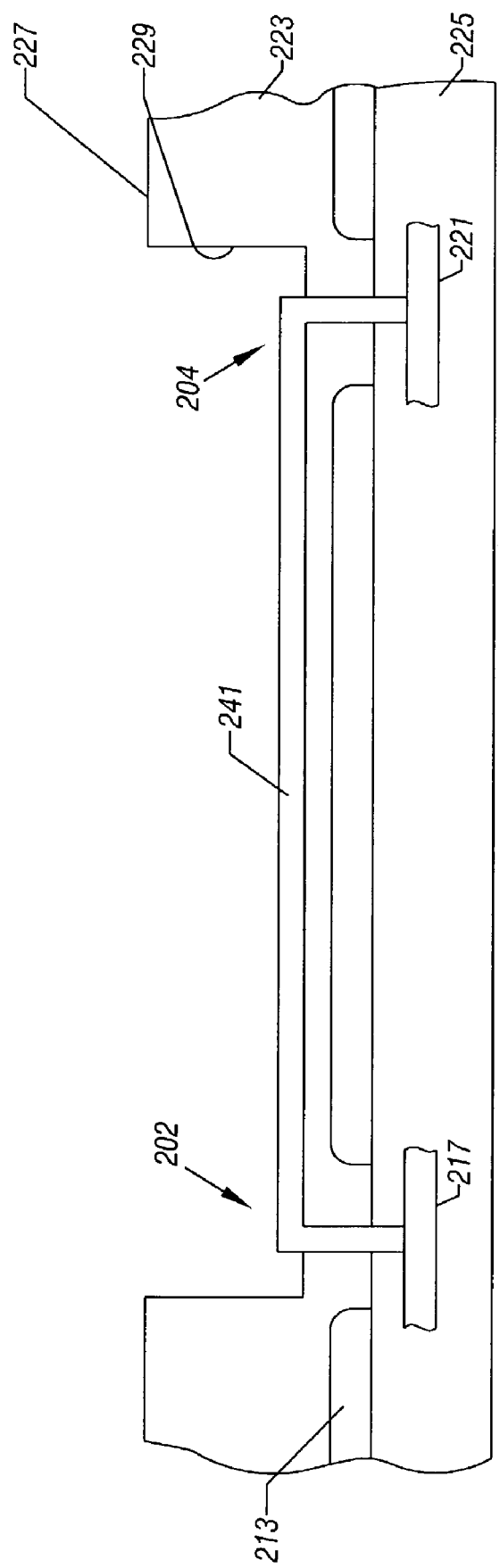
FIG. 4 is an enlarged cross-section of a flip-chip packaged integrated circuit die with a conductor deposited between two circuit edit connection targets over the back side of the integrated circuit die in accordance with one embodiment of the present invention.

After the vias 215, 219 have been formed, a conductor 241 is deposited over the silicon substrate to couple connection targets 202 and 204 together, as illustrated in FIG. 4. Connection target 202 is now coupled to connection target 204 through conductor 241 to couple together signal line 217 and signal line 221. In one embodiment, conductor 241 includes any metal, including metals having tungsten, platinum, or other organo-metallics, such as gold, copper, or silver based compounds. Thus, conductor 241 provides a circuit edit connection between signal lines 217 and 221 from the back side 227 of integrated circuit die 201.

The metal conductor 241 may be deposited using only one step to provide both the vertical and horizontal extents of the conductor 241. In one embodiment, a one-step process may be implemented using focused ion beam deposited metal interconnects directly on the back side of the flip-chip integrated device semiconductor substrate. The focused ion beam deposited metal adheres very well to a silicon substrate. In fact, that metal may adhere to silicon better than some dielectric films adhere to silicon. The resulting die 201 may exhibit improved overall circuit reliability in some embodiments because step coverage of metal is significantly improved compared to processes using a dielectric underlayer.

In accordance with another technique for depositing the conductor 241 in one step, a low resistance metal deposition technique may be utilized. Low resistance metal deposition utilizes laser induced metal deposition to form the conductor 241 in a single step. As laser deposition may produce heat, it is always desirable to control the heat to avoid any adverse impact on temperature sensitive components within the integrated circuit die 201. The application of heat through laser induced metal deposition may be controlled to reduce such adverse effects.

Figure 5:
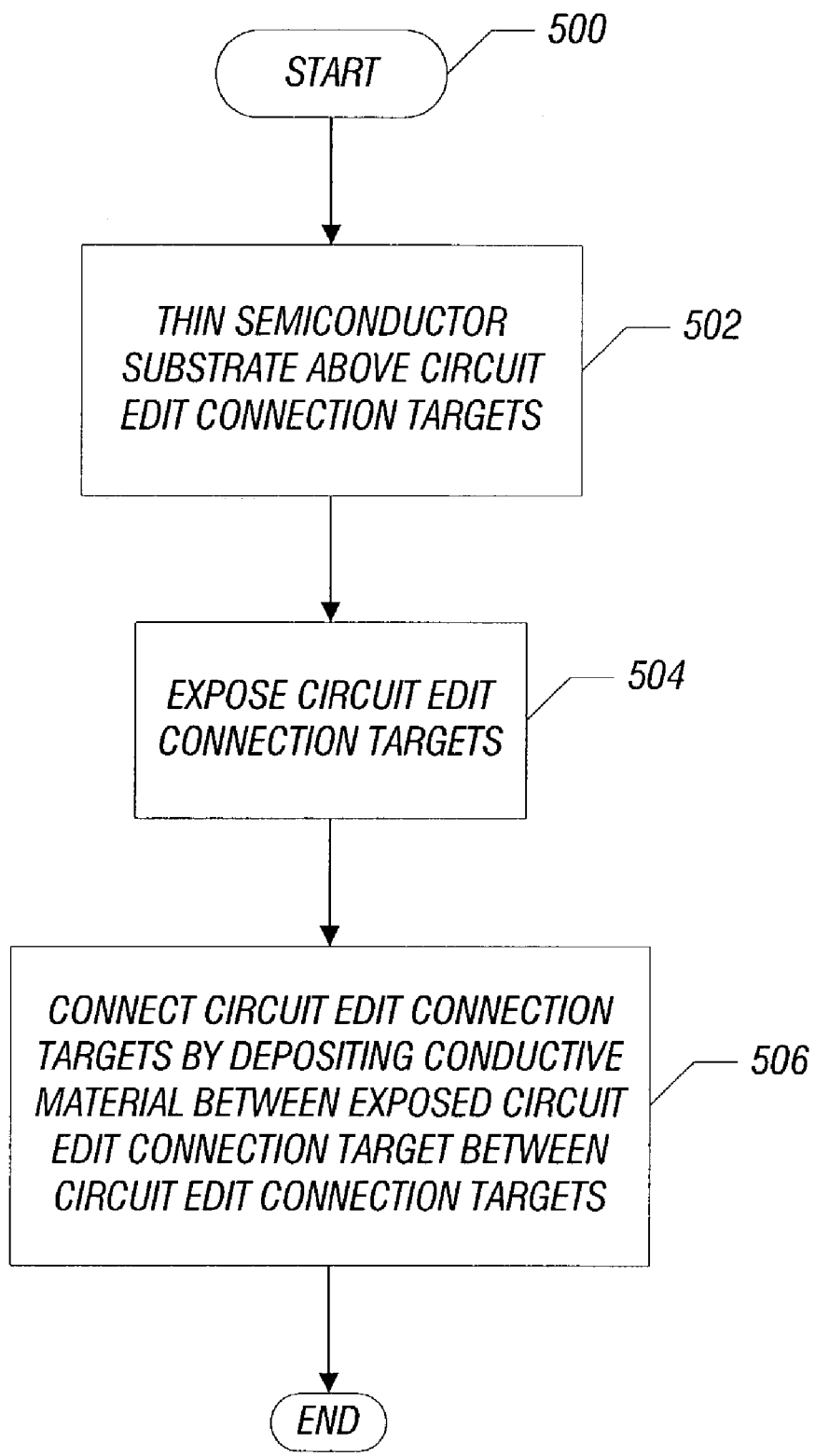
FIG. 5 is a flow chart diagram illustrating the circuit edit steps performed on a flip-chip packaged integrated circuit die in accordance with one embodiment of the present invention.

Flow chart 500 of FIG. 5 shows circuit edit steps performed through the back side of an integrated circuit die in accordance with one embodiment of the present invention. When adding a circuit edit connection between two circuit edit connection targets in an integrated circuit, the semiconductor substrate may first be thinned above the circuit edit connection targets as shown in processing block 502. Next, the circuit edit connection targets are exposed according to processing block 504. The two circuit edit connection targets are connected by depositing conductive material between the exposed circuit edit connection targets over silicon substrates between the circuit edit connection targets, as shown in processing block 506.

Thus, in some embodiments of the present invention, process throughput and reliability may be improved. By depositing metal directly on the semiconductor substrate, process complexity is reduced and reliability may be improved. Forming the conductor 241 in one step, in some embodiments of the present invention, may be advantageous in some embodiments for improving throughput. In some cases the adhesion may be improved compared to processes which deposit the conductor over a dielectric and smaller access holes may be used in some embodiments.

It is believed that prior art techniques involving the deposition of metal over an insulator to make circuit edits were motivated by concerns that, because the semiconductor substrate is grounded, it was necessary to provide insulation between the substrate and the conductor that is applied in the editing process. The inventors of the present invention realize that that is not the case. The inherent resistance of the substrate is sufficient, compared to the conductivity of the conductor 241, to avoid adverse effects from the grounding of the substrate. Thus, the inventors have appreciated that the use of an interconnect over insulator is unnecessary and that the interconnect may be formed directly on substrate with advantageous results.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    exposing, from a back side of the integrated circuit die, edit connection targets through a semiconductor substrate of the integrated circuit die; and
    using a laser induced metal deposition to deposit a non-ground signal conductor directly on the substrate from the first to the second circuit edit connection targets.

2. The method of claim 1 including thinning the semiconductor substrate of the integrated circuit die from the back side of the integrated circuit die.

3. The method of claim 1 including depositing the conductor using a focused ion beam metal deposition.

4. The method of claim 1 including depositing said conductor in one step.

5. The method of claim 1 including forming said conductor with vertical and horizontal portions and forming said portions in one step.

6. The method of claim 1 including forming contact vias to said targets and making contact to said targets, filing said vias, and connecting said vias in one step.

* * * * *